(12) United States Patent
Wang et al.

(10) Patent No.: US 8,212,943 B2
(45) Date of Patent: Jul. 3, 2012

(54) TRIPLE-CONVERSION TELEVISION TUNER

(75) Inventors: Fucheng Wang, San Jose, CA (US); Chao-Tung Yang, Hsinchu (TW); Yi Lu, Hsinchu (TW)

(73) Assignee: MSTAR Semiconductor, Inc., Hsinchu (TW)

( * ) Notice: Subject to any disclaimer, the term of this patent is extended or adjusted under 35 U.S.C. 154(b) by 1286 days.

(21) Appl. No.: 11/924,389

(22) Filed: Oct. 25, 2007

(65) Prior Publication Data

US 2008/0100755 A1 May 1, 2008

Related U.S. Application Data

(60) Provisional application No. 60/862,978, filed on Oct. 25, 2006.

(51) Int. Cl.
*H04N 5/46* (2006.01)
*H04N 5/50* (2006.01)

(52) U.S. Cl. .................. 348/731; 348/729; 348/E5.108

(58) Field of Classification Search .................. 348/729, 348/731, E5.108
See application file for complete search history.

(56) References Cited

U.S. PATENT DOCUMENTS

| | | | |
|---|---|---|---|
| 4,653,117 A | 3/1987 | Heck | |
| 5,479,449 A * | 12/1995 | Patel et al. | 375/316 |
| 5,636,252 A * | 6/1997 | Patel et al. | 375/345 |
| 5,737,035 A | 4/1998 | Rotzoll | |
| 5,739,874 A | 4/1998 | Badger et al. | |
| 5,956,075 A | 9/1999 | Matsuo | |
| 7,450,185 B2 | 11/2008 | Wu | |
| 2004/0125240 A1 | 7/2004 | Stikvoort et al. | |
| 2005/0001937 A1 | 1/2005 | Lee et al. | |
| 2005/0003773 A1 | 1/2005 | Cowley et al. | |
| 2005/0090213 A1 | 4/2005 | Heng et al. | |
| 2005/0117071 A1 | 6/2005 | Johnson | |
| 2005/0164662 A1 | 7/2005 | Tseng et al. | |
| 2006/0001779 A1 | 1/2006 | Favrat et al. | |
| 2006/0078069 A1 | 4/2006 | Seendripu et al. | |
| 2007/0132889 A1 | 6/2007 | Pan | |
| 2007/0140391 A1 | 6/2007 | Pan | |

(Continued)

FOREIGN PATENT DOCUMENTS

CN 1619970 A 5/2005

(Continued)

OTHER PUBLICATIONS

Mark Dawkins et. al., "A Single-Chip Tuner for DVB-T," IEEE Journal of Solid-State Circuits, vol. 38, No. 8, Aug. 2003.

(Continued)

*Primary Examiner* — Kieu Oanh T Bui
(74) *Attorney, Agent, or Firm* — Kirton McConkie; Evan R. Witt (57) ABSTRACT

A television tuner employs a triple-conversion architecture to translate VHF/UHF TV signals to various standard IF frequencies. The television tuner includes a harmonic rejection mixer, a first image rejection mixer and a second image rejection mixer. The television tuner receives a television signal. The harmonic rejection mixer up-converts the television signal into a first IF signal according to a first reference signal with a fixed frequency. The first image rejection mixer further up-converts the first IF signal into a second IF signal according to a second reference signal with a tunable frequency. The second image rejection mixer down-converts the second IF signal into a third IF signal according to a third reference signal with a tunable frequency.

18 Claims, 5 Drawing Sheets

U.S. PATENT DOCUMENTS

2007/0218850 A1* 9/2007 Pan .......................... 455/189.1
2008/0164662 A1* 7/2008 Luckenbaugh et al. ........ 279/60

FOREIGN PATENT DOCUMENTS

| | | |
|---|---|---|
| CN | 1798287 A | 7/2006 |
| TW | 315549 | 9/1997 |
| TW | I249348 | 2/2006 |
| TW | I253856 | 4/2006 |
| TW | 200618626 | 6/2006 |
| WO | 2004064246 A1 | 7/2004 |
| WO | 2005091493 A1 | 9/2005 |

OTHER PUBLICATIONS

Jan Van Sinderen et. al., "A 48-80 MHz Digital Cable Tuner IC with Integrated RF and IF selectivity," ISSCC 2003, Session 25.3.

D. Salas et. al., "A 0.12 mm CMOS DVB-T tuner," ISSCC 2005, Session 23.3.

Chun-Huat Heng et. al., "A CMOS TV Tuner/Demodulator IC with Digital Image Rejection," IEEE Journal of solid State Circuits, vol. 40, No. 12, p. 2525, Dec. 2005.

* cited by examiner

TRIPLE-CONVERSION TELEVISION TUNER

CROSS REFERENCE TO RELATED PATENT APPLICATION

This application claims the benefit of U.S. Provisional Application No. 60/862,978 filed Oct. 25, 2006.

FIELD OF THE INVENTION

The present invention relates to a television tuner, and more particularly to a triple-conversion television tuner for frequency-translating a television signal to a desired IF frequency which facilitates the subsequent demodulation process.

BACKGROUND OF THE INVENTION

In general, the spectrum of a VHF (very high frequency) or UHF (ultra high frequency) radio-frequency television signal lies between 48 MHz and 860 MHz. Within this range, a plurality of channels are covered and each channel is typically allocated with a bandwidth of 6~8 MHz. In NTSC standard, a video carrier frequency positions at 1.25 MHz above the lower-margin of the bandwidth; a color carried frequency positions at 3.58 MHz higher than the video carrier frequency; while an audio carrier frequency positions at 4.5 MHz higher than the video carrier frequency. For example, Channel 2 has a bandwidth of 6 MHz ranged from 54 MHz to 60 MHz. Meanwhile, the video carrier frequency, color carrier frequency and audio carrier frequency position at 55.25 MHz, 58.83 MHz and 59.75 MHz, respectively.

When the radio-frequency television signal having the above-mentioned feature is received by an antenna or a cable and transmitted to the television tuner, the television tuner selects one or more channels accordingly, and converts the associated signal into an intermediate frequency (IF) signal or a base-band frequency signal which are subsequently processed by a demodulator.

Figure 1:
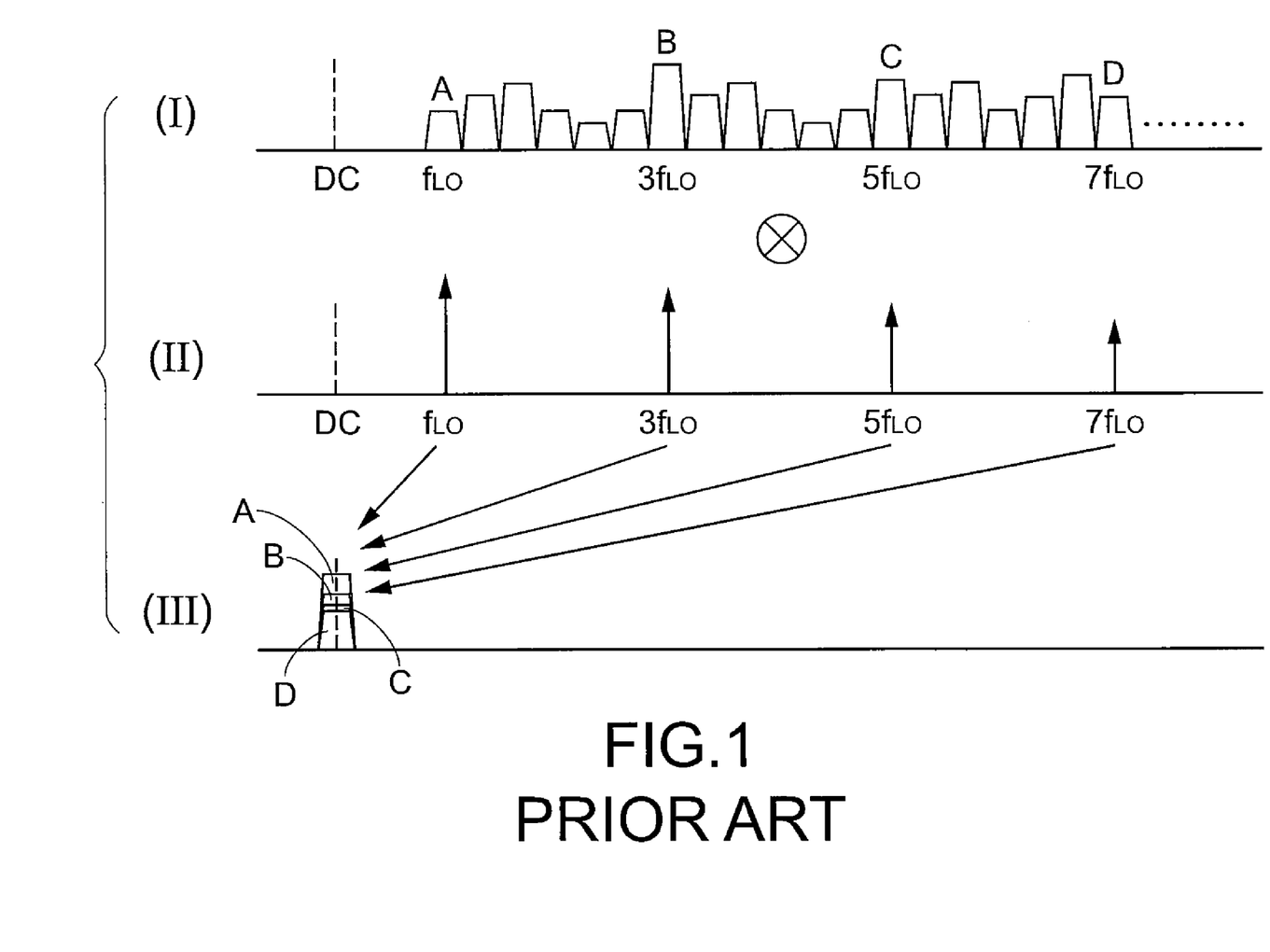
FIG. 1 is a schematic diagram showing a traditional single conversion operation.

In early ages, a conventional CAN tuner includes a mixer for directly down-converting the radio-frequency television signal into an intermediate frequency signal or a base-band frequency signal, as illustrated in FIG. 1. The radio-frequency television signal (I) including a plurality of channels multiplies a reference signal (II) with a reference frequency $f_{LO}$ in the mixer. In this way, a channel A with a frequency band positioned at the reference frequency $f_{LO}$ can be down-converted into a base-band frequency signal.

Applying a switching mixer, the reference signal is a square-wave signal having a 50% duty cycle. A plurality of harmonic frequencies, e.g. 3 $f_{LO}$, 5 $f_{LO}$, 7 $f_{LO}$, etc., coming from the reference signal are also down-converted to the base-band frequency signal together with the reference frequency $f_{LO}$. Channels B, C and D position at the harmonic 3 $f_{LO}$, 5 $f_{LO}$, 7 $f_{LO}$, respectively. In other words, the associated signals of the channels A, B, C and D all appear in the base-band signal (III).

For readily identifying the desired channel A, the signal power of the channel A is supposed to be much higher, for example 30 dB higher than any co-channel interferer to maintain a desirable signal quality. Assuming on a condition that the signal power of either channel B, C or D is adversely 30 dB higher than that of the channel A, a component for providing at least the 60-dB harmonic rejection ratio is required to alleviate possible SNR (signal-to-noise ratio) degradation.

Conventionally, several RF (radio-frequency) tracking filters are utilized to reduce the harmonic power of the radio-frequency television signal prior to the entrance of the radio-frequency television signal into the mixer, in order to solve the above-mentioned harmonic problem.

However, such a tuner is generally bulky due to the incorporation of several discrete electronic devices such as the above-mentioned RF tracking filters, and thus is called as a CAN tuner. Moreover, the RF tracking filters require a high voltage varactor for band tuning. It is thus not only cost-ineffective but also hard to be integrated into a single-chip IC (integrated circuit) for reducing the module footprint.

With remarkable advances of semiconductor technologies to produce highly integrated silicon chips, a television tuner can also be manufactured as a single chip so as to reduce device size and cost. U.S. Pat. No. 5,737,035 discloses such a television tuner and is incorporated herein for reference.

Figure 2:
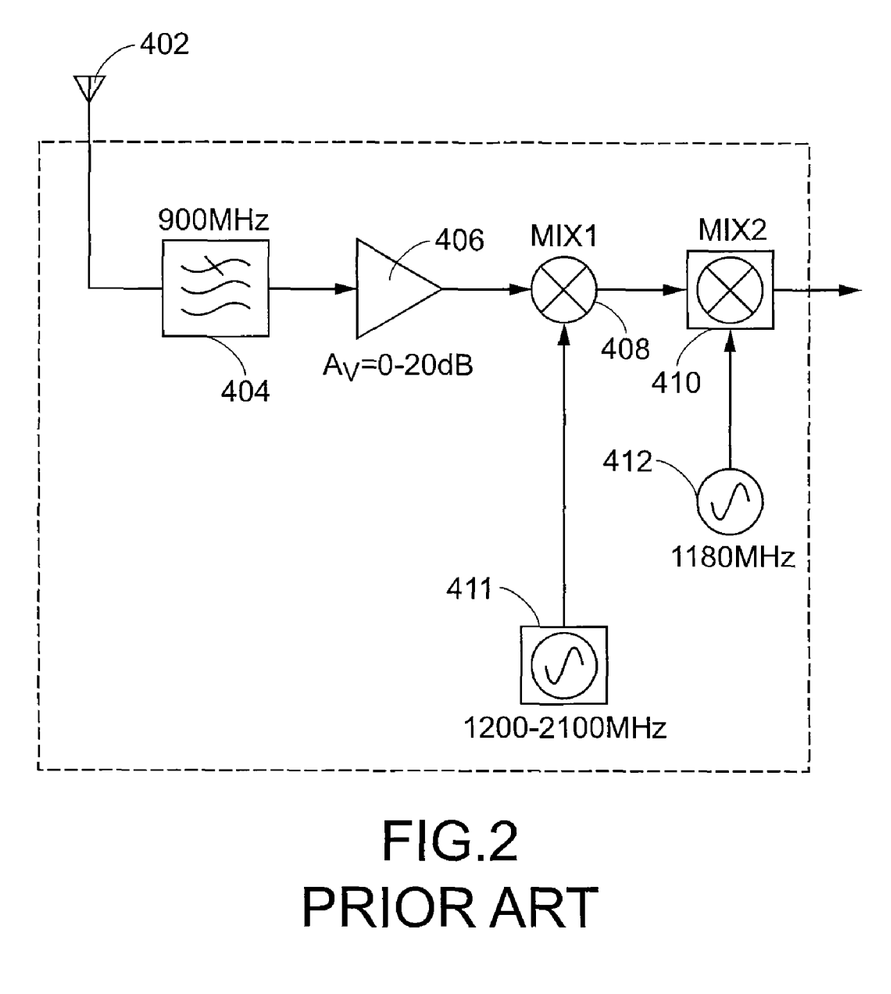
FIG. 2 is a circuit block diagram schematically illustrating a conventional dual conversion television tuner.

A single-chip television tuner as suggested by U.S. Pat. No. 5,737,035 is illustrated in FIG. 2, wherein an up-down dual conversion tuner with two mixers is used. After a radio-frequency television signal is received by an antenna 402 (or a cable), it is first subjected to a cutoff frequency of, e.g. 900 MHz, an RF lowpass filter 404 to result in a frequency band below 900 MHz. Then the filtered radio-frequency television signal passes through a low-noise transconductance amplifier (LNTA) 406 so as to be amplified with a certain gain, e.g. 20 dB. Subsequently, the amplified radio-frequency television signal is mixed with a first reference signal in a first mixer 408 to output a first intermediate frequency signal. The first intermediate frequency signal is then mixed with a second reference signal in a second mixer 410 to output a second intermediate frequency signal so as to extract a desired channel with a specified carrier frequency.

The first mixer 408 is a subtractive mixer and the first reference signal is generated by a first local oscillator 411 to have an operating frequency tunable in the range between 1200 MHz and 2100 MHz. By adjusting the frequency of the first reference signal, the carrier frequency of a desired channel included in the resulting first intermediate frequency signal can be obtained as 1200 MHz. On the other hand, the second mixer 410 is an image rejection mixer and the second reference signal is generated by a second local oscillator 412 to have an operating frequency of 1180 MHz. With the mixing of the second reference signal, the carrier frequency of the desired channel included in the resulting second intermediate frequency signal can be obtained at 20 MHz, i.e. (1200-1180) MHz. The first mixer 408 up-converts the carrier frequency of the desired channel to 1200 MHz to minimize harmonic effects, and then the second mixer 410 down-converts the carrier frequency of the desired channel to 20 MHz.

Figure 3:
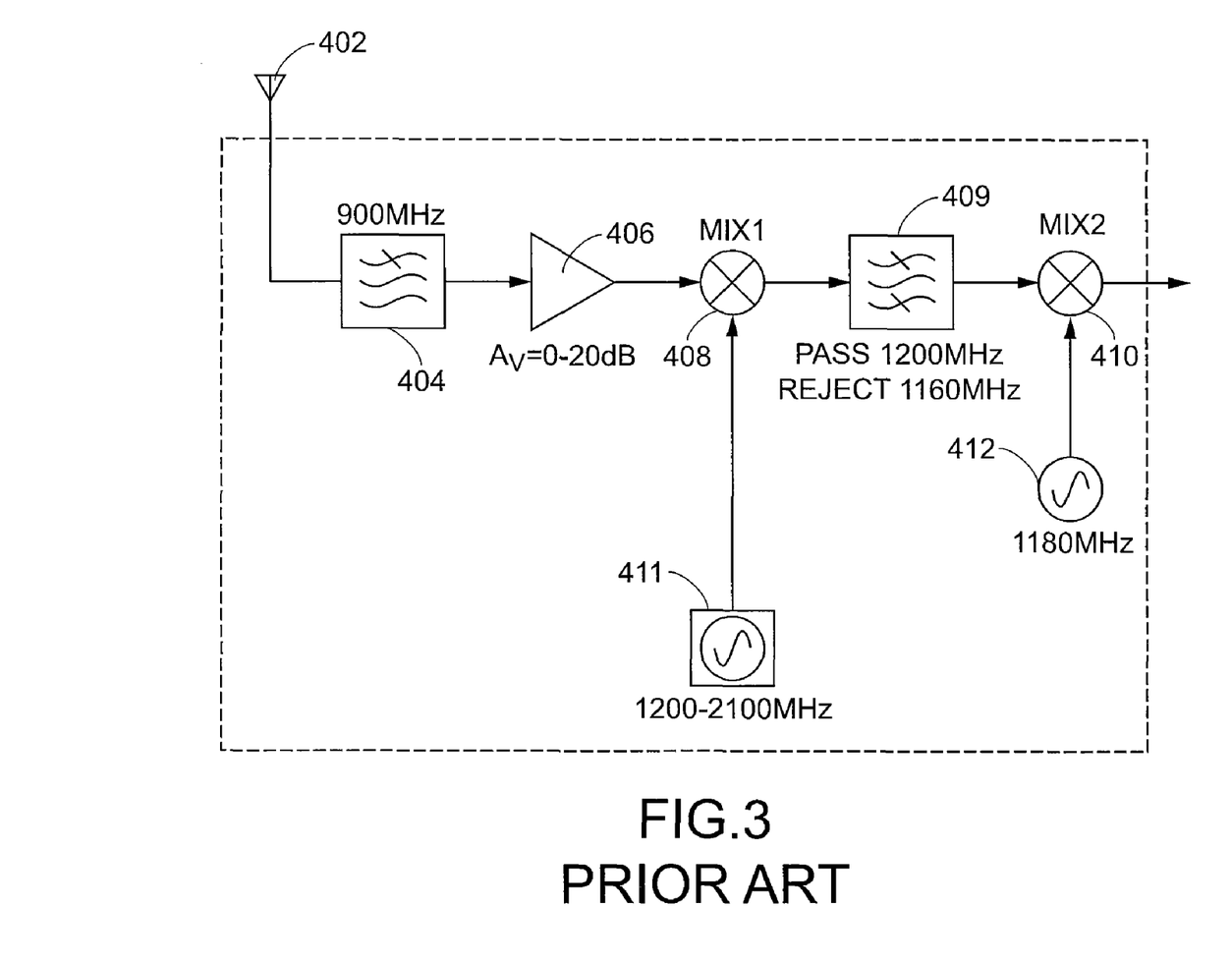
FIG. 3 is a circuit block diagram schematically illustrating another conventional dual conversion television tuner.

This tuner rejects signal energy in the first intermediate frequency signal that is in the area of 1160 MHz, which would also yield |1160-1180|=20 MHz. FIG. 3 illustrates another up-down dual conversion tuner similar to the tuner of FIG. 2 but further including an IF filter 409 between the mixers 408 and 410 to reject the image frequency component 1160 MHz from the first intermediate frequency signal.

The above-mentioned single-chip television tuners use a reference signal with a tunable frequency and another reference signal with a fixed frequency to mix the radio-frequency television signal to obtain the carrier frequency of the desired channel. In order to adjust the frequency of the first reference signal in a relatively wide range, a plurality of voltage controlled oscillators (VCOs) are needed and that results in higher circuit complexity and chip size.

SUMMARY OF THE INVENTION

Therefore, the present invention suggests a novel television tuner architecture with reduced device size and cost compared to conventional tuners.

The present invention provides a triple conversion television tuner for frequency-translating a television signal, which includes a first local oscillator generating a first reference signal with a fixed frequency; a first mixer receiving and converting the television signal into a first IF signal according to the first reference signal; a second local oscillator generating a second reference signal with a tunable frequency; a second mixer receiving and converting the first IF signal into a second IF signal according to the second reference signal so as to convert a carrier frequency of a specified channel into the first target carrier frequency; a third local oscillator generating a third reference signal with a tunable frequency; and a third mixer receiving and converting the second IF signal into a third IF signal according to the third reference signal so as to convert the carrier frequency of the specified channel into the second target carrier frequency; wherein the first target carrier frequency is higher than the second target carrier frequency.

Preferably, the first mixer is a harmonic rejection mixer for up-converting the received television signal, the second mixer is an image rejection mixer for up-converting the first IF signal, and the third mixer is another image rejection mixer for down-converting the second IF signal.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 4:
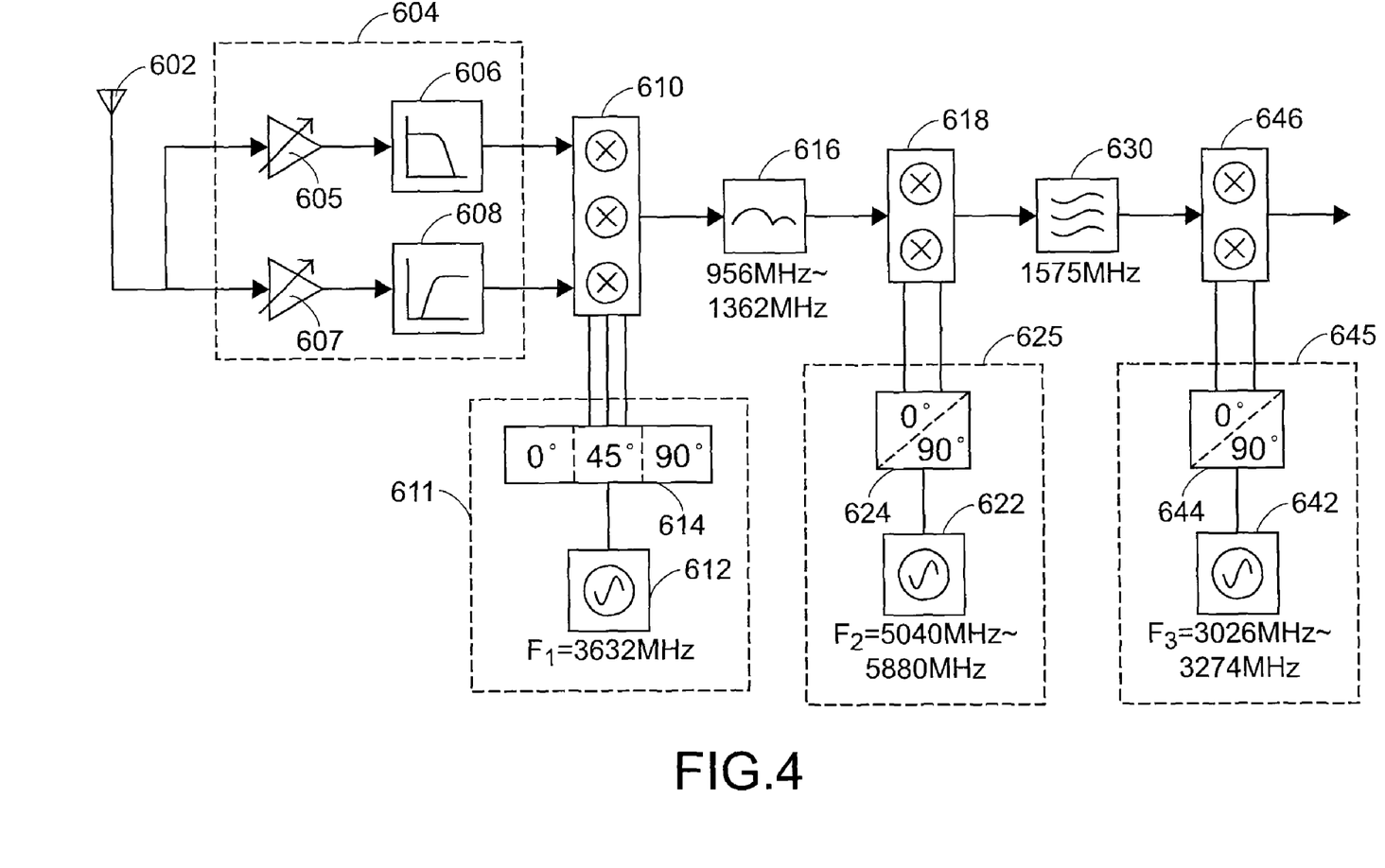
FIG. 4 is a circuit block diagram schematically illustrating a triple conversion television tuner according to an embodiment of the present invention.

Please refer to FIG. 4. An up-up-down triple conversion television tuner according to an embodiment of the present invention is illustrated. The television tuner principally includes an RF band selection filter 604 for primarily filtering an input television signal ranged between 48 MHz to 860 MHz, three local oscillators 611, 625 and 645 for generating first, second and third reference signals, and three mixers 610, 618 and 646 for mixing the input television signal with the first, second and third reference signals, respectively, thereby achieving the conversion into various standard intermediate frequencies ranged between 30 MHz to 60 MHz. In this embodiment, the first mixer 610 performs an up-conversion operation, the second mixer 625 performs another up-conversion operation, and the third mixer 645 performs a down-conversion operation.

The radio-frequency television signal, after being received from an antenna 602 (or a cable), is passed through the RF band selection filter 604 so that a signal with a specific band is primarily extracted from the input television signal. For example, the RF band selection filter 604 extracts either a first-band signal from 48 MHz to 450 MHz or a second-band signal from 450 MHz to 860 MHz. If the channel to be frequency-translated is within the first-band signal, it is desired to filter off the signal portion with higher frequency than 450 MHz from the input television signal. The filtering operation is performed by a first variable gain amplifier 605 and a low-pass filter 606 of the RF band selection filter 604. On the other hand, if the channel to be frequency-translated is within the second-band signal, it is desired to filter off the signal portion with lower frequency than 450 MHz from the input television signal. The filtering operation is performed by a second variable gain amplifier 607 and a high-pass filter 608 of the RF band selection filter 604. The resulting first-band or second-band signal, after being additively or subtractively mixed with the first reference signal, will be up-converted into an IF (intermediate frequency) signal having a frequency range between 956 MHz and 1362 MHz. Meanwhile, the carrier frequency of the specified channel lies in the range between 956 MHz and 1362 MHz.

The mixer 610 serves as a harmonic rejection mixer for eliminating harmonic effects resulting from the first reference signal and performs broadband up-conversion, so the resulting first IF signal is a broadband IF signal. In this embodiment, as shown in FIG. 4, the first reference signal includes three signals of the same frequency at different phases, e.g. at 0, 45 and 90 degrees. After the input television signal is mixed with the first reference signal, the up-converted first IF signal has a frequency range between 956 MHz and 1362 MHz. For generating the first reference signal having a frequency at 908 MHz or 1816 MHz and three phases at 0, 45 and 90 degrees, the first local oscillator 611 includes a first voltage controlled oscillator (VCO) 612 and a first processing circuit 614. The first VCO 612 generates an oscillating signal of 3632 MHz, and the first processing circuit 614 is implemented with a frequency divider and a multi-phase signal generator where the oscillating signal is divided by two or four to result in the desired frequency at 1816 MHz or 908 MHz and three phases at 0, 45 and 90 degrees.

Preferably, the first IF signal is filtered by an LC (inductor-capacitor) tank 616 to filter off signals beyond the frequency range 956~1362 MHz. The resulting first IF signal is then inputted into the second mixer, which is an image rejection mixer, and up-converted into a second IF signal by mixing with the second reference signal. Meanwhile, the carrier frequency of the specified channel is converted to 1575 MHz.

For converting the carrier frequency of the specified channel to 1575 MHz, the second reference signal for mixing with the first IF signal preferably has a frequency range between 2520 MHz and 2940 MHz. The second reference signal in this range can be generated by the second local oscillator 625 including a second VCO 622 and a second processing circuit 624. The second VCO 622 has a tunable oscillating frequency range of 5040~5880 MHz. The second processing circuit 624 is implemented with a frequency divider and a quadrature-phase signal generator. The oscillating signal outputted by the second VCO 622 is frequency-divided by the second processing circuit 624 by 2 so as to result in the frequency range of 2520~2940 MHz for the second reference signal. The second reference signal preferably includes two quadrature-phase signals having a phase difference by 90 degrees. Since the frequency of the second reference signal is tunable by the second local oscillator 625, it can be properly selected to convert the first IF signal into the second IF signal with the carrier frequency of the specified channel converted into 1575 MHz, while eliminating the image frequency. Preferably, the second IF signal is further passed through a surface acoustic wave (SAW) filter 630 having a center frequency at 1575 MHz to remove additional unwanted in-band channels. The resulting third IF signal outputted by the SAW filter 630 with a carrier frequency of 1575 MHz may include one or more channel signals, e.g. three channels. The third IF signal is then inputted into the third mixer, which is also an image rejection mixer, and down-converted into a low IF signal of, for example, 40 MHz with the third reference signal.

The third reference signal is generated by the third local oscillator 645, which includes a third VCO 642 and a third processing circuit 644. In order to convert the carrier frequency of the specified channel into the low IF, the third VCO 642 has a tunable frequency range from 3026 MHz to 3274 MHz. After the divided-by-two operation by the third processing circuit 644, which is implemented with a frequency divider and a quadrature-phase signal generator, the third reference signal is obtained to include two quadrature-phase signals having a frequency range of 1513~1637 MHz and a phase difference by 90 degrees. Since the frequency of the third reference signal is tunable by the third local oscillator 645, it can be properly selected to convert the third IF signal into the low IF signal so that the carrier frequency of the specified channel is thus converted into the low intermediate frequency, while eliminating the image frequency. Accordingly, a pure low IF signal without discernible SNR degradation caused by any folded in-band interferers can be obtained for the subsequent demodulation process. Alternatively, the third IF signal can be at the baseband frequency.

Figure 5:
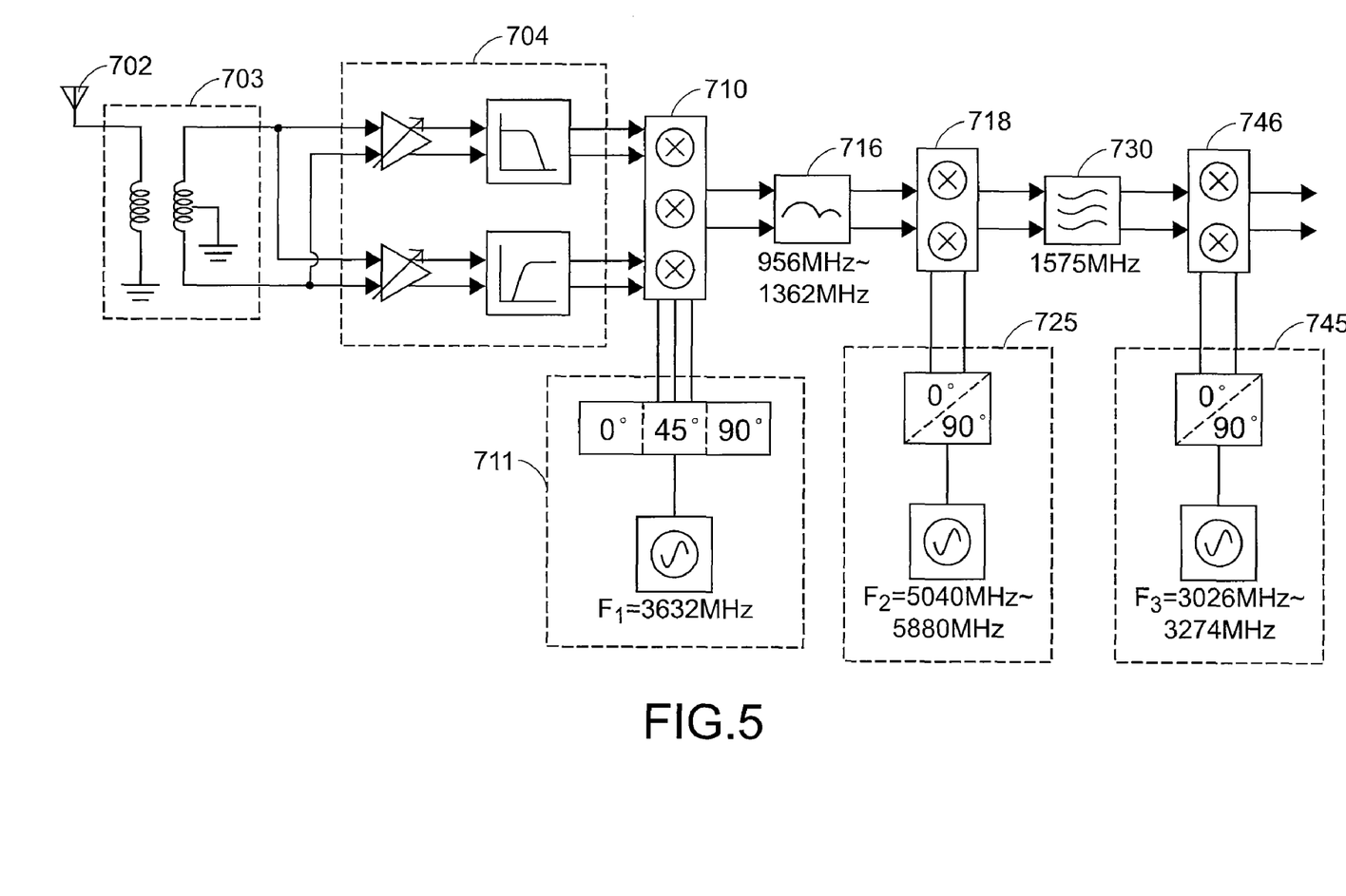
FIG. 5 is a circuit block diagram schematically illustrating a triple conversion television tuner according to another embodiment of the present invention.

According to another embodiment of the present invention, as shown in FIG. 5, a single-ended input television signal received from the antenna 702 (or a cable) is converted to a differential signal by a single-to-differential converter 703 in advance in order to eliminate a common mode noise. Afterwards, the television signal is band-selected by an RF band selection filter 704 and triple mixed by harmonic rejection mixer 710, LC tank 716, first image rejection mixer 718, SAW filter 730 and second image rejection mixer 746 according to first, second and third reference signals, respectively generated by first, second and third local oscillators 711, 725 and 745 in a manner similar to those described in the embodiment of FIG. 4. Thereby the desired low IF signal or base-band frequency signal can be obtained.

The single-to-differential converter 703 can be an off-chip balun. Alternatively, the single-to-differential converter 703 can also be integrated on chip.

In a further embodiment, the associated signals in the television tuner are interlaced single-ended and differential signals. For example, the first IF signal outputted by the LC tank 716 can be a differential signal, while the first image rejection mixer 718 may leave a single-ended second IF signal to accommodate the single-ended SAW filter input. Furthermore, after receiving and filtering the single-ended second IF signal, the SAW filter 730 may output a differential third IF signal which is inputted into the second image rejection mixer 746 to result in a differential low IF signal or a differential base-band frequency signal.

It is understood from the above embodiments that by way of up-up-down triple conversion according to the present invention, each of the local oscillators can be implemented by a narrow-band VCO to generate a proper reference signal for mixing. Therefore, the chip size can be thus optimized and a single-chip television tuner is much easier to be realized.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A television tuner for frequency-translating a television signal, comprising:
    a first local oscillator for generating a first reference signal with a fixed frequency;
    a first mixer for receiving and converting the television signal into a first IF signal according to the first reference signal;
    a second local oscillator for generating a second reference signal with a tunable frequency;
    a second mixer for receiving and converting the first IF signal into a second IF signal according to the second reference signal, so as to convert a carrier frequency of a specified channel into a first target carrier frequency;
    a third local oscillator for generating a third reference signal with a tunable frequency; and
    a third mixer for receiving and converting the second IF signal into a third IF signal according to the third reference signal, so as to convert the carrier frequency of the specified channel into a second target carrier frequency;
    wherein the first target carrier frequency is higher than the second target carrier frequency.

2. The television tuner according to claim 1 wherein the television signal is a radio frequency (RF) signal and the television tuner further comprises an RF band selection filter for extracting a desired-band signal from the RF signal prior to the input to the first mixer.

3. The television tuner according to claim 2 wherein the RF band selection filter extracts either a low-band signal or a high-band signal from the television signal, and includes:
    a first set of variable gain amplifier and low-pass filter for filtering off noise frequencies above the low-band signal when the low-band signal is extracted by the RF band selection filter; and
    a second set of variable gain amplifier and high-pass filter for filtering off noise frequencies below the high-band signal when the high-band signal is extracted by the RF band selection filter.

4. The television tuner according to claim 1 wherein the first mixer is a harmonic rejection mixer for up-converting the received television signal, the second mixer is an image rejection mixer for up-converting the first IF signal, and the third mixer is another image rejection mixer for down-converting the second IF signal.

5. The television tuner according to claim 1 wherein the third IF signal is a low IF signal or a base-band frequency signal.

6. The television tuner according to claim 1 further comprising an LC (inductor-capacitor) tank disposed between the first mixer and the second mixer for filtering off noise from the first IF signal.

7. The television tuner according to claim 1 further comprising a surface acoustic wave (SAW) filter disposed between the second mixer and the third mixer for filtering off noise from the second IF signal.

8. The television tuner according to claim 7 wherein the SAW filter has a center frequency substantially at the first target carrier frequency of the specified channel.

9. The television tuner according to claim 1 wherein the first local oscillator includes:
    a voltage control oscillator (VCO) for generating an oscillating signal with a fixed frequency; and a processing circuit coupled to the voltage control oscillator for generating the first reference signal according to the oscillating signal.

10. The television tuner according to claim 9 wherein the processing circuit includes a frequency divider and a multi-phase signal generator for dividing the oscillating signal by an integer, and the first reference signal includes a plurality of signals having the same frequency at a plurality of different phases.

11. The television tuner according to claim 1 wherein the second local oscillator includes:
 a voltage control oscillator (VCO) for generating an oscillating signal having a tunable frequency; and
 a processing circuit coupled to the voltage control oscillator for generating the second reference signal according to the oscillating signal.

12. The television tuner according to claim 11 wherein the processing circuit includes a frequency divider and a quadrature-phase signal generator for generating the second reference signal by dividing the oscillating signal by an integer, and the second reference signal includes a plurality of quadrature-phase signals having a phase difference by 90 degrees.

13. The television tuner according to claim 1 wherein the third local oscillator includes:
 a voltage control oscillator (VCO) for generating an oscillating signal having a tunable frequency; and
 a processing circuit coupled to the voltage control oscillator for generating the third reference signal according to the oscillating signal.

14. The television tuner according to claim 13 wherein the processing circuit includes a frequency divider and a quadrature-phase signal generator for generating the third reference signal by dividing the oscillating signal by an integer, and the third reference signal includes a plurality of quadrature-phase signals having a phase difference by 90 degrees.

15. The television tuner according to claim 1 wherein the television signal received by an antenna of the television tuner is a single-ended signal.

16. The television tuner according to claim 15 further comprising a single-to-differential converter disposed upstream of the first mixer for converting the single-ended television signal into a differential television signal prior to mixing with the first reference signal.

17. The television tuner according to claim 16 wherein the single-to-differential converter is an off-chip balun.

18. The television tuner according to claim 16 wherein the single-to-differential converter is integrated on chip.

* * * * *